United States Patent [19]

Sato

[11] 4,350,905
[45] Sep. 21, 1982

[54] COMPLEMENTARY MOS LOGIC DECODER CIRCUIT

[75] Inventor: Yasushi Sato, Oita, Japan
[73] Assignee: Tokyo Shibaura Denki Kabushiki Kaisha, Japan
[21] Appl. No.: 90,421
[22] Filed: Nov. 1, 1979
[30] Foreign Application Priority Data

Jan. 19, 1979 [JP] Japan .................................. 54-4936

[51] Int. Cl.³ ................. H03K 19/094; H03K 19/173; H03K 19/20; H03K 13/00
[52] U.S. Cl. .................................. 307/451; 307/449; 340/347 DD
[58] Field of Search .................. 307/449, 451, 463; 340/803, 804, 347 DD; 365/103, 104, 230

[56] References Cited

U.S. PATENT DOCUMENTS

| | | | |
|---|---|---|---|
| 3,613,055 | 10/1971 | Varadi et al. | 307/463 X |
| 3,651,342 | 3/1972 | Dingwall | 307/451 X |
| 3,679,911 | 7/1972 | Kaufman | 307/449 |
| 3,825,772 | 7/1974 | Ainsworth | 307/451 X |
| 3,938,109 | 2/1976 | Gionis et al. | 307/463 X |
| 4,063,118 | 12/1977 | Nishimura | 307/449 |
| 4,124,900 | 11/1978 | Smith et al. | 307/463 X |
| 4,189,782 | 2/1980 | Dingwall | 307/449 X |

OTHER PUBLICATIONS

Craig et al., "Cross-coupled FET Driver Circuit;" IBM Tech. Discl. Bull.; vol. 17, No. 12, pp. 3538; 5/1975.
RCA Solid State "COS/MOS Integrated Circuit;" SSD250, 1977, p. 114, CD 4028B Type COS/MOS BCD to Decimal Decoder.

Primary Examiner—Larry N. Anagnos
Attorney, Agent, or Firm—Finnegan, Henderson, Farabow, Garrett & Dunner

[57] ABSTRACT

A logic circuit having a first logic means for producing a first logic output signal having a plurality of MOS transistors of a first channel type, a second logic means for producing a second logic output having a plurality of MOS transistors of the first channel type, a first MOS transistor of a second channel type connected to the output terminal of the first logic output, and a second MOS transistor of the second channel type connected to the output terminal of said second logic output. In the logic circuit, the output terminal for the first logic output signal is coupled with the gate of the second MOS transistor. The output terminal for the second logic output is connected to the gate of the first MOS transistor.

5 Claims, 2 Drawing Figures

COMPLEMENTARY MOS LOGIC DECODER CIRCUIT

BACKGROUND OF THE INVENTION

The present invention relates to a logic circuit and, more particularly, to a CMOS (complementary metal oxide semiconductor) logic circuit well adaptable for decoders, ROMs (read only memories) and the like comprised of P-channel MOS (metal oxide semiconductor) transistors and N-channel MOS transistors.

Basically, the CMOS logic circuit is so arranged that a plurality of MOS transistors of the same channel type are connected in parallel, a plurality of MOS transistors of the opposite channel to that of the parallel connected ones are connected in series, and a logic output signal is taken out from the connection point between the parallel connected MOS transistors and the serially connected MOS transistors.

Normally, the CMOS logic circuit is applied for decoders, ROMs and the like. In the specification, a case where it is applied to a decoder will be described for ease of explanation.

FIG. 1 shows a conventional decoder comprised of a CMOS logic arrangement. Table 1 shows a truth table illustrating a relation between binary code input signals and decimal code output signals, which is used in the decoder shown in FIG. 1.

TABLE 1

(Truth Table)

| Binary Coded Inputs | | | | Decimal Coded Outputs | | | | | | | | | |
|---|---|---|---|---|---|---|---|---|---|---|---|---|---|
| D | C | B | A | 0 | 1 | 2 | 3 | 4 | 5 | 6 | 7 | 8 | 9 |
| L | L | L | L | H | L | L | L | L | L | L | L | L | L |
| L | L | L | H | L | H | L | L | L | L | L | L | L | L |
| L | L | H | L | L | L | H | L | L | L | L | L | L | L |
| L | L | H | H | L | L | L | H | L | L | L | L | L | L |
| L | H | L | L | L | L | L | L | H | L | L | L | L | L |
| L | H | L | H | L | L | L | L | L | H | L | L | L | L |
| L | H | H | L | L | L | L | L | L | L | H | L | L | L |
| L | H | H | H | L | L | L | L | L | L | L | H | L | L |
| H | L | L | L | L | L | L | L | L | L | L | L | H | L |
| H | L | L | H | L | L | L | L | L | L | L | L | L | H |

In FIG. 1 illustrating the decoder, there is illustrated a circuit construction for producing decimal coded output signals of '0', '5' and '9' alone, for simplicity of illustration. The circuit construction for producing, for example, output signals '1' to '4', '6' to '8', '10' are omitted in the figure. In FIG. 1, N1 to N12 designate N-channel MOS transistors and P1 to P12 P channel MOS transistors, respectively. The N channel MOS transistors N1 to N4 enclosed by dotted line are connected in parallel. Similarly, a group of transistors N5 to N8 enclosed by dotted line 14 and another group of transistors N9 to N12 enclosed by dotted line 16 are each connected in parallel, respectively.

A group of P channel MOS transistors P1 to P4 within a dotted line block 18, a group of P channel MOS transistors P5 to P8, within a dotted line block 20 and a group of P channel MOS transistors P9 to P12 within a dotted line block 22 are each connected in series, as shown.

A terminal 24, normally connected to a zero potential point, is a power source terminal for the N channel MOS transistors N1 to N12. A terminal 26, normally connected to +5 V, is a power source terminal for the P channel transistors P1 to P12. Input signal lines $L_{I1}$ to $L_{I8}$ are connected to input terminals IN1 to IN4 and $\overline{IN1}$ to $\overline{IN4}$, as shown. Input signals A to D are applied to the input terminals IN1 to IN4, respectively. Inverse input signals $\overline{A}$ to $\overline{D}$, which are in opposite phase to those A to D, are inputted to the input terminals $\overline{IN1}$ to $\overline{IN4}$, respectively.

A decimal coded input signal '0' is taken out from an output terminal OUT1 which is a connecting point between the group of the transistors N1 to N4 within the block 12 and the group of the transistors P1 to P4 within the block 18. OUT2 is a connection point between the transistor block 14 and the transistor block 20, from which a decimal coded output signal '5' is taken out. OUT3 is a connection point between the transistor block 16 and the transistor block 22, from which a decimal code output signal '9' is taken out.

Reference characters A to D designate input signals applied to the input terminals IN1 to IN4. Characters $\overline{A}$ to $\overline{D}$ are input signals applied to the input terminals $\overline{IN1}$ to $\overline{IN4}$, respectively, which are in opposite phase with the input signals A to D.

In the CMOS decoder with such a construction, the decimal coded output signals '0,' '5,' and '9' are expressed by the following logical expressions $$'0' = \overline{A + B + C + D}$$

$$'5' = \overline{\overline{A} + B + \overline{C} + D}$$

$$'9' = \overline{\overline{A} + B + C + \overline{D}}$$

The conventional decoder including the CMOS logic circuits as shown in FIG. 1 is problematic in the integrated fabrication and the switching speed.

Generally, the mobility $\mu$ (p) of a hole is slower than that of $\mu$ (n) of an electron. Therefore, a circuit connection with P channel MOS transistors connected in series, as shown in FIG. 1, is not preferable in the light of the switching speed. Further, in the circuit arrangement shown in FIG. 1, the input lines $L_{I1}$ to $L_{I8}$ must be formed entering not only an area where the N channel MOS transistors are formed as indicated by 12, 14 and 16, but also an area where the P channel MOS transistors are formed as indicated 18, 20 and 22. The line formation extending to the P channel MOS transistor area superfluously occupies a chip area, resulting in ineffective utilization of the chip area.

SUMMARY OF THE INVENTION

With a view of overcoming the above-mentioned disadvantages, an object of the invention is to provide a logic circuit which provides a high switching speed and is suitable for a high density integration of its fabrication.

According to the invention, there is provided a logic circuit comprising: first logic means including a plurality of MOS transistors of a first channel type which receives a plurality of logic input signals and produces a first logic output signal; second logic means including a plurality of MOS transistors of the first channel type which receives the logic input signals and produces a second logic output signal; a first MOS transistor of a second channel type connected to an output terminal for the first logic output signal of the first logic means; and a second MOS transistor of the second channel type connected to an output terminal for the second logic output of the second logic means, wherein the gate of the first MOS transistor is connected to the output terminal of the second logic means and the gate of the second MOS transistor is connected to the output terminal of the first logic means.

Other objects and features of the invention will be apparent from the following description taken in connection with the accompanying drawings, in which:

DETAILED DESCRIPTION OF THE PREFERRED EMBODIMENT

Figure 1:
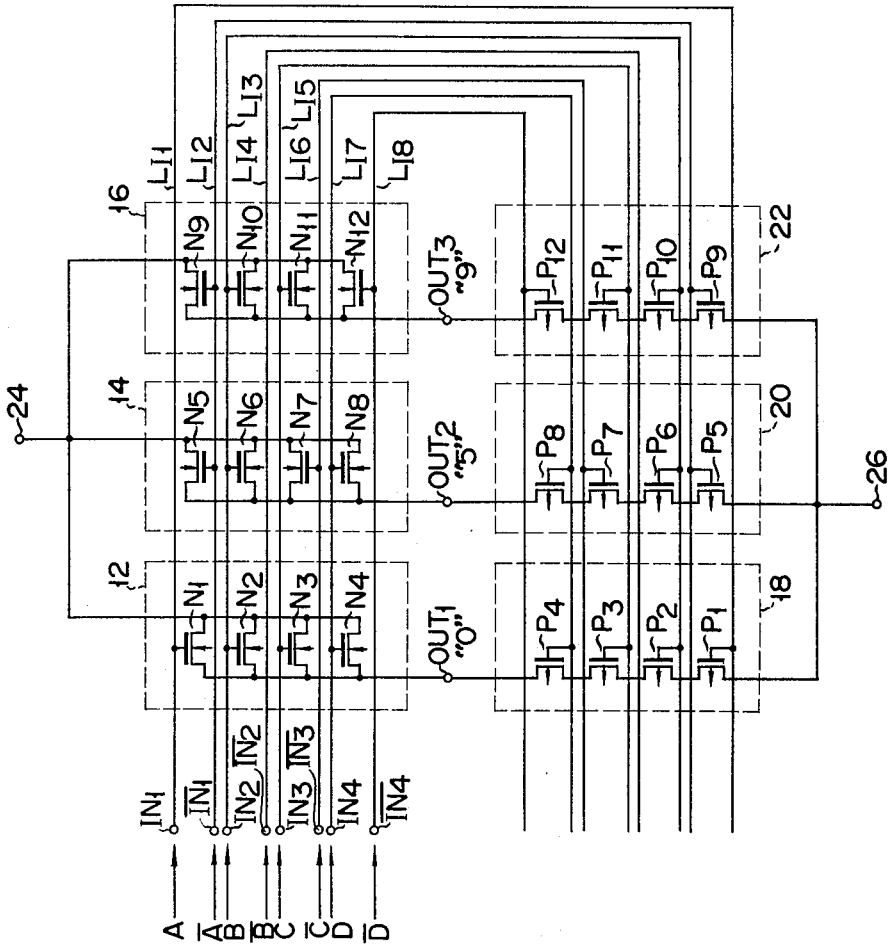
FIG. 1 shows circuit diagram of a conventional logic circuit constructed in the form of a decoder.
Figure 2:
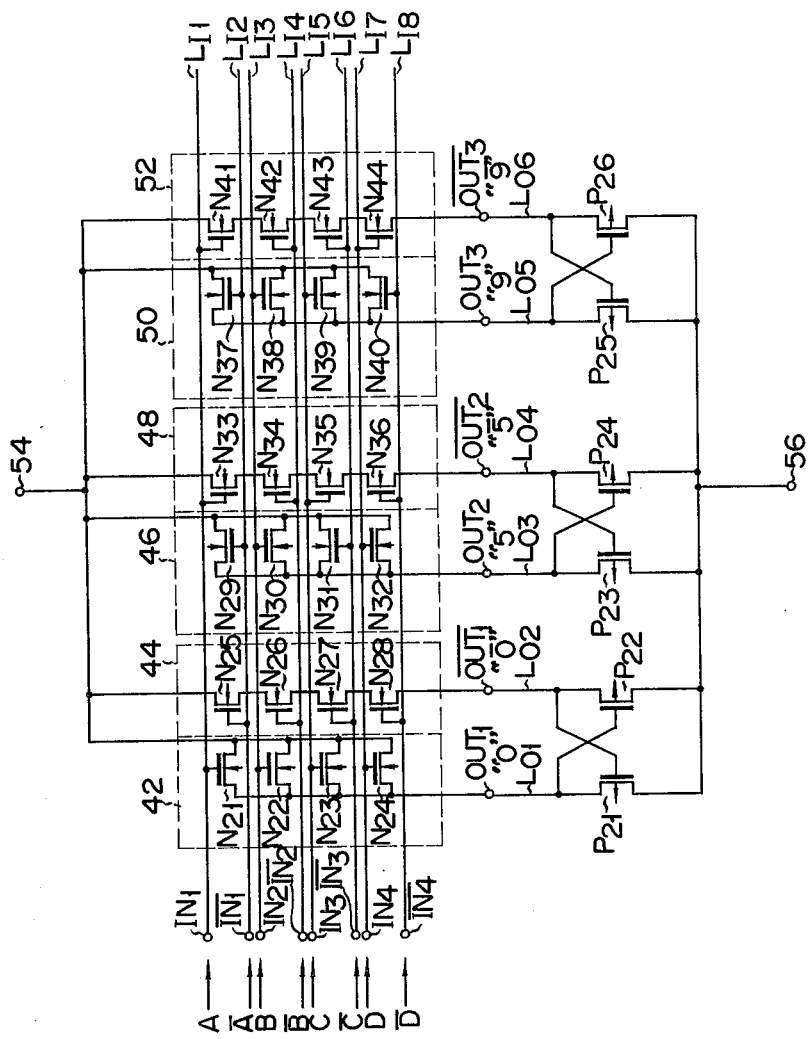
FIG. 2 shows a circuit diagram of an embodiment of a logic circuit according to the invention, which is constructed in the form of a decoder.

Referring to FIG. 2, there is shown a logic circuit constructed in the form of a decoder, which is an embodiment according to the invention. The decoder shown in FIG. 2 is designed corresponding to the decoder shown in FIG. 1. Accordingly, only the logic circuit portion for producing decimal coded output signals '0,' '5' and '9' is illustrated as in the circuit shown in FIG. 1, together with a circuit portion for producing the inverse logic outputs '$\overline{0}$,' '$\overline{5}$' and '$\overline{9}$' and '0,' '5'and '9.

In FIG. 2, N21 to N44 designate N-channel MOS transistors and P21 to P26 designate P channel MOS transistors. As enclosed by a dotted block 42, the transistors N21 to N24 are connected in parallel with one another. As enclosed by dotted block 44, the transistors N25 to N28 are connected in series. Similarly, the transistors N29 to N32 enclosed by dotted block 46 are connected in parallel. The transistors N33 to N36 enclosed by dotted block 48 are connected in series. The transistors N37 to N40 enclosed by dotted block 50 are connected in parallel with one another. The transistors N41 to N44 are connected in series as enclosed by dotted block 52. The N channel MOS transistors N21 to N24 are connected at the sources to a power source terminal 54, and at the drains to the drain of the P channel MOS transistor P21. The source of the P channel MOS transistor P21 is connected to a power source terminal 56. The source terminal of the series circuit including the N channel MOS transistors N25 to N28 is connected to the power source terminal 54. The drain terminal of the series circuit is connected to the drain of the P channel MOS transistor P22. The source of the P channel MOS transistor P22 is connected to the power source terminal 56. The transistor group including N channel MOS transistors N29 to N32 connected in parallel is connected at the source to the power source terminal 54 and at the drain to the drain of the P channel MOS transistor P23. The source of the P channel MOS transistor P23 is connected to the power source terminal 56. The transistor group including N channel MOS transistors N33 to N36 connected in series is connected at the source terminal to the power source terminal 54, and at the drain terminal to the drain of the P channel MOS transistor P24. The source of the P channel transistor P24 is connected to the power source terminal 56. The parallel connection having the N channel MOS transistors N37 to N40 is connected at the source to the power source terminal 54 and at the drain to the drain of the P channel MOS transistor P25. The source of the P channel MOS transistor P25 is connected to the power source terminal 56. A series circuit having the N channel MOS transistors N41 to N44 is connected at the source terminal to the power source terminal 54, and at the drain terminal to drain of the P channel MOS transistor P26. The source of the P channel MOS transistor P26 is connected to the power source terminal 56.

The power source terminal 54 is connected to a zero potential point, for example, and the power source terminal 56 is connected to a high potential point, for example, +5 V.

Input lines $L_{I1}$ to $L_{I8}$ are coupled with input terminals IN1 to IN4 and $\overline{IN}1$ to $\overline{IN}4$, as shown. Input signals A to D and $\overline{A}$ to $\overline{D}$ are inputted to the input terminals IN1 to IN4 and $\overline{IN}1$ to $\overline{IN}4$, as shown. The input signals $\overline{A}$ to $\overline{D}$ are in opposite phase with the input signals A to D, respectively. The gates of the N channel MOS transistors N21, N33 and N41 are coupled with the input line $L_{I1}$ for receiving the input signal $\overline{A}$. The gates of the N channel MOS transistors N25, N29 and N37 are coupled with the input line $L_{I2}$ for receiving the inversed input signal A. The gates of the N channel MOS transistors N22, N30 and N38 are coupled with the input line $L_{I3}$ for receiving the input signal B. The gates of the N channel MOS transistors N26, N34 and N42 are coupled with the input line $L_{I4}$ for the inversed input signal $\overline{B}$. The gates of the N channel MOS transistors N23, N35 and N39 are coupled with the input line $L_{I5}$ for reception of the input signal C. The gates of the N channel MOS transistors N27, N31 and N43 are connected to the input terminal $L_{I6}$ for reception of the input signal $\overline{C}$. The gates of the N channel MOS transistors N24, N32 and N44 are coupled with the input line $L_{I7}$ for reception of the input signal D. The gates of the N channel MOS transistors N28, N36 and N40 are coupled with the input line $L_{I8}$ so as to receive the input signal $\overline{D}$.

A connection line connecting the parallel transistor circuit denoted as 42 to the P channel MOS transistor P21 forms an output line $L_{O1}$ connecting to the gate of the P channel MOS transistor P22. OUT1 is an output terminal of the output line $L_{O1}$.

Similarly, connection lines connecting the N channel transistor circuits and the P channel transistor circuits denoted as 44, 46, 48, 50 and 52, form output lines $L_{O1}$ to $L_{O6}$ connecting to the gates of the P channel MOS transistors P22 to P26, respectively. The output lines $L_{O2}$ to $L_{O6}$ are provided with output terminals OUT1 to OUT3 and $\overline{OUT}1$ to $\overline{OUT}3$, as shown.

Relations between binary coded input signals and decimal coded output signals in the decoder thus constructed are illustrated in the truth table shown in Table 2.

As seen from the truth table, the decimal coded output signals of '0,' '$\overline{0}$,' '5,' '$\overline{5}$,' '9' and '$\overline{9}$' are expressed by:

TABLE 2
(Truth Table)

$$'0' = \overline{A + B + C + D}$$

$$'\overline{0}' = \overline{\overline{A} \cdot \overline{B} \cdot \overline{C} \cdot \overline{D}} = \overline{\overline{A + B + C + D}}$$

$$'5' = \overline{\overline{A} + B + \overline{C} + D}$$

$$'\overline{5}' = \overline{A \cdot \overline{B} \cdot C \cdot \overline{D}} = \overline{\overline{\overline{A} + B + \overline{C} + D}}$$

$$'9' = \overline{\overline{A} + B + C + \overline{D}}$$

$$'\overline{9}' = \overline{A \cdot \overline{B} \cdot \overline{C} \cdot D} = \overline{\overline{\overline{A} + B + C + \overline{D}}}$$

| Binary Coded Inputs | | | | | | | | Decimal Coded Outputs | | | | | | | | | | | | | | | | | |
|---|---|---|---|---|---|---|---|---|---|---|---|---|---|---|---|---|---|---|---|---|---|---|---|---|---|
| $\overline{D}$ | D | $\overline{C}$ | C | $\overline{B}$ | B | $\overline{A}$ | A | 0 | $\overline{0}$ | 1 | $\overline{1}$ | 2 | $\overline{2}$ | 3 | $\overline{3}$ | 4 | $\overline{4}$ | 5 | $\overline{5}$ | 6 | $\overline{6}$ | 7 | $\overline{7}$ | 8 | $\overline{8}$ | 9 | $\overline{9}$ |
| H | L | H | L | H | L | H | L | H | L | L | H | L | H | L | H | L | H | L | H | L | H | L | H | L | H | L | H |
| H | L | H | L | H | L | L | H | L | H | H | L | L | H | L | H | L | H | L | H | L | H | L | H | L | H | L | H |
| H | L | H | L | L | H | L | H | L | H | L | H | H | L | L | H | L | H | L | H | L | H | L | H | L | H | L | H |
| H | L | H | L | L | H | H | L | L | H | L | H | L | H | H | L | L | H | L | H | L | H | L | H | L | H | L | H |
| H | L | L | H | H | L | L | H | L | H | L | H | L | H | L | H | H | L | L | H | L | H | L | H | L | H | L | H |
| H | L | L | H | H | L | H | L | L | H | L | H | L | H | L | H | L | H | H | L | L | H | L | H | L | H | L | H |
| H | L | L | H | L | H | H | L | L | H | L | H | L | H | L | H | L | H | L | H | H | L | L | H | L | H | L | H |
| H | L | L | H | L | H | H | L | L | H | L | H | L | H | L | H | L | H | L | H | L | H | H | L | L | H | L | H |
| L | H | H | L | H | L | H | L | L | H | L | H | L | H | L | H | L | H | L | H | L | H | L | H | H | L | L | H |
| L | H | H | L | H | L | L | H | L | H | L | H | L | H | L | H | L | H | L | H | L | H | L | H | L | H | H | L |

The operation of the decoder as mentioned above will be described, giving an emphasis on the operations of the parallel transistor circuit denoted as 42 and the P channel MOS transistor P21, for producing logical '0' and '$\overline{0}$', and the series transistor circuit denoted as 44 and the P channel MOS transistor P22, for simplicity of explanation.

Assume now that at least one input signal, for example, A, of those A to D is high in level.

On this assumption, the N channel MOS transistor N21 is turned on, so that the potential level of the output terminal OUT1 is low in level and the P channel MOS transistor P22 is turned on. Accordingly, if at least one of the input signals A to D is high, the potential levels at the output terminals OUT1 and $\overline{OUT1}$ are low and high, respectively.

At this time, the input signal A at low level is applied to the N channel MOS transistor N25, the transistor N25 is turned off, so that the P channel MOS transistor P21 is turned off.

Let us consider now a case where all the input signals A to D are low in level.

In this case, all the N channel MOS transistors N21 to N24 are turned off, so that the potential level of the output terminal OUT1 becomes high in level, so that the P channel MOS transistor P22 is turned off. Input signals $\overline{A}$ to $\overline{D}$ at high level are applied to the N channel MOS transistors N25 to N28, with the result that the N channel MOS transistors N25 to N28 are all turned on and the zero potential level at the output terminal $\overline{OUT1}$ becomes low in level and the P channel MOS transistor P21 is turned on.

In other words, when the input signals A to D are all low in level, the potential levels at the output terminals OUT1 and $\overline{OUT1}$ become high and low in level, respectively.

As described above, the potential level at the output terminal OUT1 becomes low only when the input signals A to D are all high in level. Accordingly, the output signal '0' is given by the logical expression '0'=$\overline{A+B+C+D}$. And the potential level at the output terminal $\overline{OUT1}$ becomes low in level on when all the input signal $\overline{A}$ to $\overline{D}$ are high in level. The output signal '$\overline{0}$' of decimal code is given by '0'=$\overline{A}\cdot\overline{B}\cdot\overline{C}\cdot\overline{D}$=$\overline{\overline{A}+\overline{B}+\overline{C}+\overline{D}}$.

The output signals at the output terminals OUT1 and $\overline{OUT1}$ are '0,' and '$\overline{0}$' and are logically inverse to each other.

As previously described, the logical operations relating to the decimal coded output signals '5', '$\overline{5}$', '9' and '$\overline{9}$' will be omitted, but the operation of the outputs '0' and '$\overline{0}$' may correspondingly be applied to the above case.

The logic circuit shown in FIG. 2 has the following advantages over the conventional logic circuits shown in FIG. 1.

The series circuit of the MOS transistors is comprised of N channel MOS transistors using electrons as carriers of which the mobility is higher than that of holes. The conventional circuit has P channel transistors using holes as carriers. In this respect, the logic circuit improves the switching speed over the conventional one. Further, the input signal lines may be wired in only the area where the N channel MOS transistors are collectively formed. Accordingly, a superfluous occupation of the chip area by the input line wiring may be eliminated, unlike the conventional logic circuit. This feature is preferable in the light of the high density integration of the circuit.

Various modifications of the invention may be allowed within the scope of the invention. For example, in the circuit in FIG. 2, the N-channel MOS transistors, which are major transistors in the circuit, may be replaced by P channel MOS transistors. In this case, the P channel MOS transistors in the circuit must be replaced by the N channel MOS transistors. Such an alternation enjoys the advantage of the high density integration attained by the above-mentioned embodiment.

Additionally, the present invention is applicable for other suitable devices than the decoder, such as ROM and other logic circuits.

What is claimed is:

1. a logic circuit to be used with first and second power sources comprising:

first logic means including a plurality of MOS transistors of a first channel type which receives a plurality of first logic input signals and produces a first logic output signal;

second logic means including a plurality of MOS transistors of the first channel type which receives second logic input signals the inverse of said first input signals and produces a second logic output signal, said second logic output signal being the inverse of said first logic output signal;

a first MOS transistor of a second channel type connected between the first power source and an output terminal for the first logic output signal of said first logic means; and a second MOS transistor of the second channel type connected between the first power source and an output terminal for the second logic output of said second logic means, wherein the gate of said first MOS transistor is connected to the output terminal of said second logic means and the gate of said second MOS transistor is connected to the output terminal of said first logic means so as to form a flip-flop circuit and the first and second logic means being respectively connected between the output terminal and the second power source.

2. A logic circuit according to claim 1, wherein the plurality of MOS transistors of the first channel type of the first and second logic means are respectively connected in series to the said first and second MOS transistors of the second channel type.

3. A logic circuit according to claim 1 or 2, wherein the first channel type is an N channel type, and the second channel type is a P channel type.

4. A logic circuit according to claim 1 or 2 wherein the first channel type is a P channel type and the second channel type is an N channel type.

5. A logic circuit to be used with first and second power sources comprising:

first logic means including a plurality of N channel type MOS transistors connected in parallel, which receives a plurality of first logic input signals and produces a first logic output signal;

second logic means including a plurality of N channel type MOS transistors connected in series, which receives a plurality of second logic input signals which are the inverse of said first input signals and produces a second logic output signal, said second logic output signal being the inverse of said first logic output signal, a first MOS transistor of a P channel type connected between the first power source and an output terminal for the first logic output of said first logic means;

a second MOS transistor of the P channel connected between the first power source and an output terminal for the second logic output signal of said second logic means, wherein the gate of said first MOS transistor is connected to the output terminal of said second logic means, and the gate of said second MOS transistor is connected to the output terminal of said first locic means so as to form a flip-flop circuit and the first and second logic means being respectively connected between the output terminal and the second power source.

* * * * *